United States Patent
Chu et al.

(10) Patent No.: US 10,466,332 B2
(45) Date of Patent: Nov. 5, 2019

(54) SYSTEMS AND METHODS FOR AN INTERLEAVED RF COIL ACQUISITION SCHEME

(71) Applicant: General Electric Company, Schenectady, NY (US)

(72) Inventors: Dashen Chu, Hartland, WI (US); Xiaoli Zhao, New Berlin, WI (US); Zhentian Xie, Hartland, WI (US); Ty Allen Cashen, Milwaukee, WI (US); Zhu Li, Pewaukee, WI (US)

(73) Assignee: General Electric Company, Schenectady, NY (US)

( * ) Notice: Subject to any disclaimer, the term of this patent is extended or adjusted under 35 U.S.C. 154(b) by 277 days.

(21) Appl. No.: 15/438,417

(22) Filed: Feb. 21, 2017

(65) Prior Publication Data

US 2018/0238987 A1    Aug. 23, 2018

(51) Int. Cl.
| | | |
|---|---|---|
| *G01R 33/565* | (2006.01) | |
| *G01R 33/58* | (2006.01) | |
| *G01R 33/36* | (2006.01) | |
| *G01R 33/341* | (2006.01) | |

(52) U.S. Cl.
CPC ..... *G01R 33/5659* (2013.01); *G01R 33/3664* (2013.01); *G01R 33/583* (2013.01); *G01R 33/341* (2013.01); *G01R 33/3621* (2013.01)

(58) Field of Classification Search
CPC combination set(s) only.
See application file for complete search history.

(56) References Cited

U.S. PATENT DOCUMENTS

| | | | |
|---|---|---|---|
| 5,477,146 A | 12/1995 | Jones | |
| 5,600,244 A | 2/1997 | Jensen et al. | |
| 5,905,378 A | 5/1999 | Giaquinto et al. | |
| 7,365,542 B1 | 4/2008 | Rohling et al. | |
| 8,207,736 B2 | 6/2012 | Chu et al. | |
| 8,624,596 B2 * | 1/2014 | Kannengiesser | G01R 33/5673 324/309 |
| 9,000,766 B2 | 4/2015 | Chu et al. | |
| 9,018,955 B2 | 4/2015 | Chu et al. | |
| 2011/0080167 A1 * | 4/2011 | Kannengisser | G01R 33/56509 324/309 |

OTHER PUBLICATIONS

Roemer, P. et al., "The NMR Phased Array," Magnetic Resonance in Medicine, vol. 16, No. 2, Nov. 1990, 34 pages.
"A New Body Coil Feeding Scheme," IP.com Prior Art Database Website, Retrieved Online at https://priorart.ip.com/IPCOM/000233816, Electronically Published Dec. 23, 2013, 9 pages.

* cited by examiner

*Primary Examiner* — Dixomara Vargas
(74) *Attorney, Agent, or Firm* — McCoy Russell LLP

(57) ABSTRACT

In one example, a method for acquiring a medical image includes activating a body radiofrequency (RF) coil in a body coil receive mode to obtain body calibration information of a subject. The method further includes, while the body RF coil is in the body coil receive mode, activating a surface RF coil in a surface coil receive mode to obtain surface calibration information of the subject, and correcting a reconstructed image with an intensity correction filter determined from the body calibration information and surface calibration information.

20 Claims, 6 Drawing Sheets

SYSTEMS AND METHODS FOR AN INTERLEAVED RF COIL ACQUISITION SCHEME

FIELD

Embodiments of the subject matter disclosed herein relate to non-invasive diagnostic imaging, and more particularly, to magnetic resonance imaging systems.

BACKGROUND

Magnetic resonance imaging (MRI) systems use radio frequency (RF) coils to acquire image information of a region of interest of a scanned object. Various types of RF coils may be used, including body (also referred to as volume) RF coils and surface RF coils. Body RF coils may obtain image information with a high level of intensity homogeneity but a low signal to noise ratio (SNR). Surface RF coils may obtain image information with a lower level of intensity homogeneity but a higher SNR. Thus, some image reconstruction techniques may leverage image information obtained from both body RF coils and surface RF coils in order to generate images with high homogeneity and high SNR.

BRIEF DESCRIPTION

In one embodiment, a method for acquiring a medical image includes activating a body radio frequency (RF) coil in a body coil receive mode to obtain body calibration information of a subject. The method further includes, while the body RF coil is in the body coil receive mode, activating a surface RF coil in a surface coil receive mode to obtain surface calibration information of the subject, and correcting a reconstructed image with an intensity correction filter determined from the body calibration information and surface calibration information.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 2:
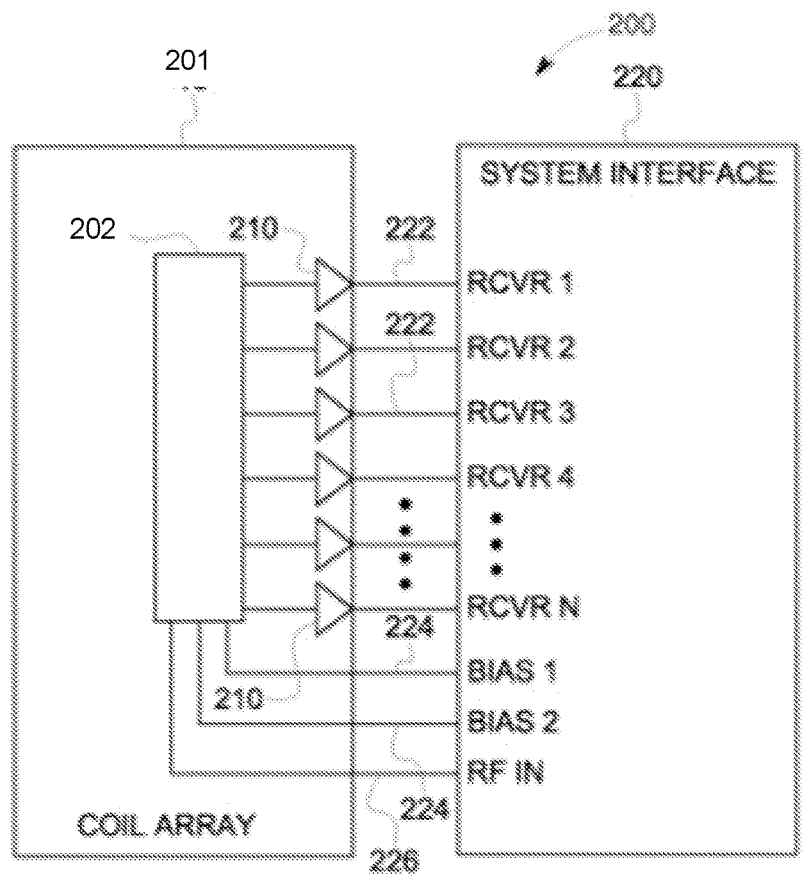
FIG. 2 is a block diagram of an embodiment of a receive section of a magnetic resonance imaging (MM) system.
Figure 3:
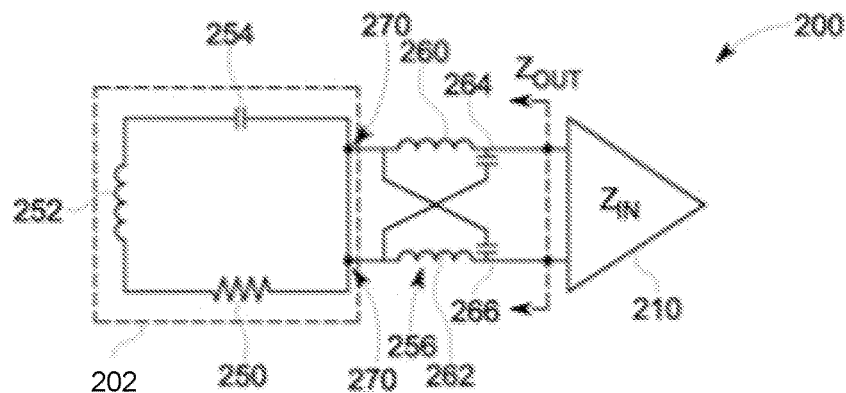
FIG. 3 is a schematic diagram of a portion of the receive section shown in FIG. 2 illustrating an embodiment of a RF receiver coil and an embodiment of a corresponding preamplifier of the receive section.
Figure 4:
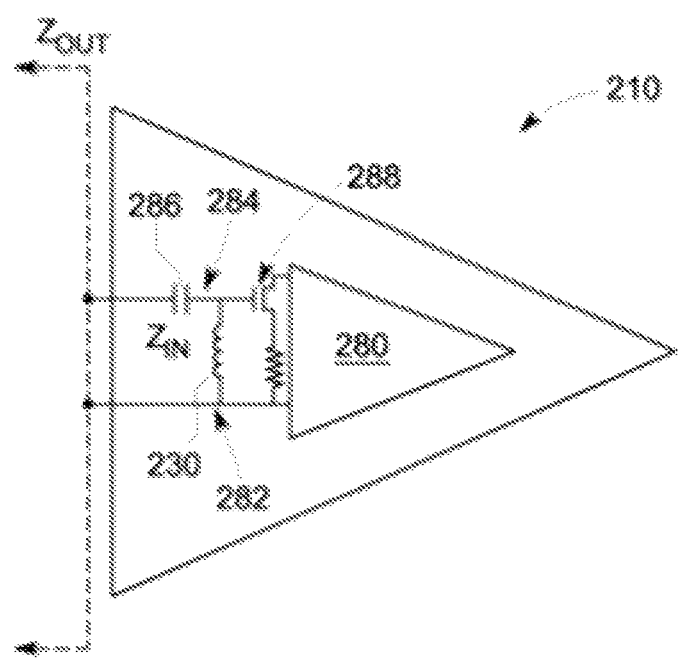
FIG. 4 is a schematic diagram illustrating an embodiment of the preamplifier shown in FIG. 3.

The following description relates to various embodiments of medical imaging systems. In particular, methods and systems are provided for body and surface radio frequency (RF) coils. An example of a magnetic resonance imaging (MM) system that may be used to acquire images is provided in FIG. 1. The MM system of FIG. 1 may include one or more body RF coils and one or more surface RF coil arrays. Each RF coil may be part of a receive circuit that includes a preamplifier, as shown in FIGS. 2-4. The MR signals received by the RF coils may be used to reconstruct an image of a region of interest according to the method illustrated in FIG. 5, including performing an interleaved calibration scan according to the method illustrated in FIG. 6. Example pulse-echo sequences during various calibration scans are illustrated in FIGS. 7A and 7B.

MRI is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Radio frequency (RF) coils are used to create pulses of RF energy at or near the resonance frequency of the hydrogen nuclei. The RF coils are used to add energy to the nuclear spins in a controlled fashion. As the nuclear spins then relax back to their rest energy state, they give up energy in the form of an RF signal. This signal is detected by the MM system and is transformed into an image using a computer and reconstruction algorithms.

MRI systems typically include a body RF coil (also referred to as a volume RF coil) and one or more surface RF coils. Body RF coils may be integrated in the gantry of the MM system, and are typically relatively large in size. Body RF coils may be activated in a transmit mode to transmit an RF pulse, as described above. However, owing to the large size and relatively distant spacing of the body RF coil from the imaged subject, resultant echoes detected by body RF coils in a receive mode (also referred to MR signals) may produce weak or noisy images. Thus, the MR signals may be detected by the surface RF coils. The surface RF coils may be relatively small compared to the body RF coil and may be placed directly over or under an area of interest of the subject to be imaged. As a result, MR signals detected by surface RF coils may be of higher resolution. However, surface RF coils do not have a high level of magnetic field uniformity and hence generate inhomogeneous images, e.g., images with varying levels of signal intensity.

One mechanism to reduce intensity heterogeneity in MM images is to apply an intensity correction filter to acquired MRI images, where the intensity correction filter is calculated from signal intensity differences between reference images obtained from the surface RF coils and reference images obtained from the more homogenous body RF coils taken during calibration scans. Typical calibration scans may include sequential body coil imaging and surface coil imaging, where only the body coil or the surface coils are enabled at any given time. The sequential body coil and surface coil imaging may lead to registration errors between the images due to subject movement between acquisition of the reference body coil images and acquisition of the reference surface coil images. Further, the sequential imaging may prolong scan times due to the same anatomy of the subject being scanned twice, and further because of the time required for the body coil to switch off before the surface coils can be switched on. Thus, in order to reduce any registration errors and decrease scanning time, it may be desirable to acquire the images from the body coil and the images from the surface coil simultaneously. However, mutual inductance coupling may occur if both the body coil and the surface coils are operated simultaneously during a receive mode, degrading image quality of both the body coil reference images and surface coil reference images.

To reduce coupling between the coils, each coil (e.g., the body coil as well as each surface coil) may be coupled to a low input impedance preamplifier and an impedance matching network that transforms the coil impedance of the respective coil into a relatively high source impedance. This impedance decoupling of the body coil and surface coils may be utilized to enable simultaneous body coil and surface coil imaging to reduce scanning duration and registration errors between images. However, even in the presence of the impedance decoupling provided by the preamplifiers and matching networks, coupling between the body coil and surface coils may still occur. The impedance decoupling provided by the preamplifier and matching network of the body coil may be consistent and robust given that Mill systems typically only include a single body coil with two channels. On the other hand, surface coils may include coil arrays of four, eight, or even sixteen coils, which may be of different sizes depending on desired imaging parameters. The impedance decoupling provided by the preamplifiers and matching networks of the surface coils is therefore less consistent due to variability in the surface coil size and design, variance in the input impedance of the preamplifiers, variations in manufacturing, etc.

As a result of the differences in the consistency and robustness of the decoupling between the body coil and the surface coils, significant coupling is essentially one sided, as the coupling only occurs from the surface coils to the body coils and not from the body coils to the surface coils. In other words, when the body coil is activated in the receive mode to obtain the body coil reference images, if the surface coils are also operated in the receive mode, coupling may occur that degrades the quality of the body coil reference images. Conversely, when the surface coils are activated in the receive mode to obtain the surface coil reference images, if the body coils are also activated in the receive mode, significant coupling does not occur and the quality of the surface coil reference images is not degraded.

Thus, according to embodiments disclosed herein, an interleaved acquisition scheme may be performed whereby high fidelity reference body coil images are obtained during calibration scans by deactivating the surface coils. Then, when the surface coils are activated to obtain reference surface coil images during the calibration scans, the body coil may remain activated in the receive mode. Such an interleaved acquisition scheme may reduce the overall time to perform the calibration scans by eliminating deactivation of the body coils, which may be relatively time consuming (e.g., 50 μsec). By performing an interleaved calibration scan with partial overlap of the coils in the receive mode, overall calibration scan time may be reduced and the time between the body coil scan and surface coil scan may also be reduced, which may in turn reduce registration errors. Further, coupling between the coils that may impact image quality may be reduced by only running the body coil and surface coils in receive mode simultaneously when the surface coil reference images are being obtained, and not running the body coil and surface coils in receive mode simultaneously when the body coil reference images are being obtained.

Figure 1:
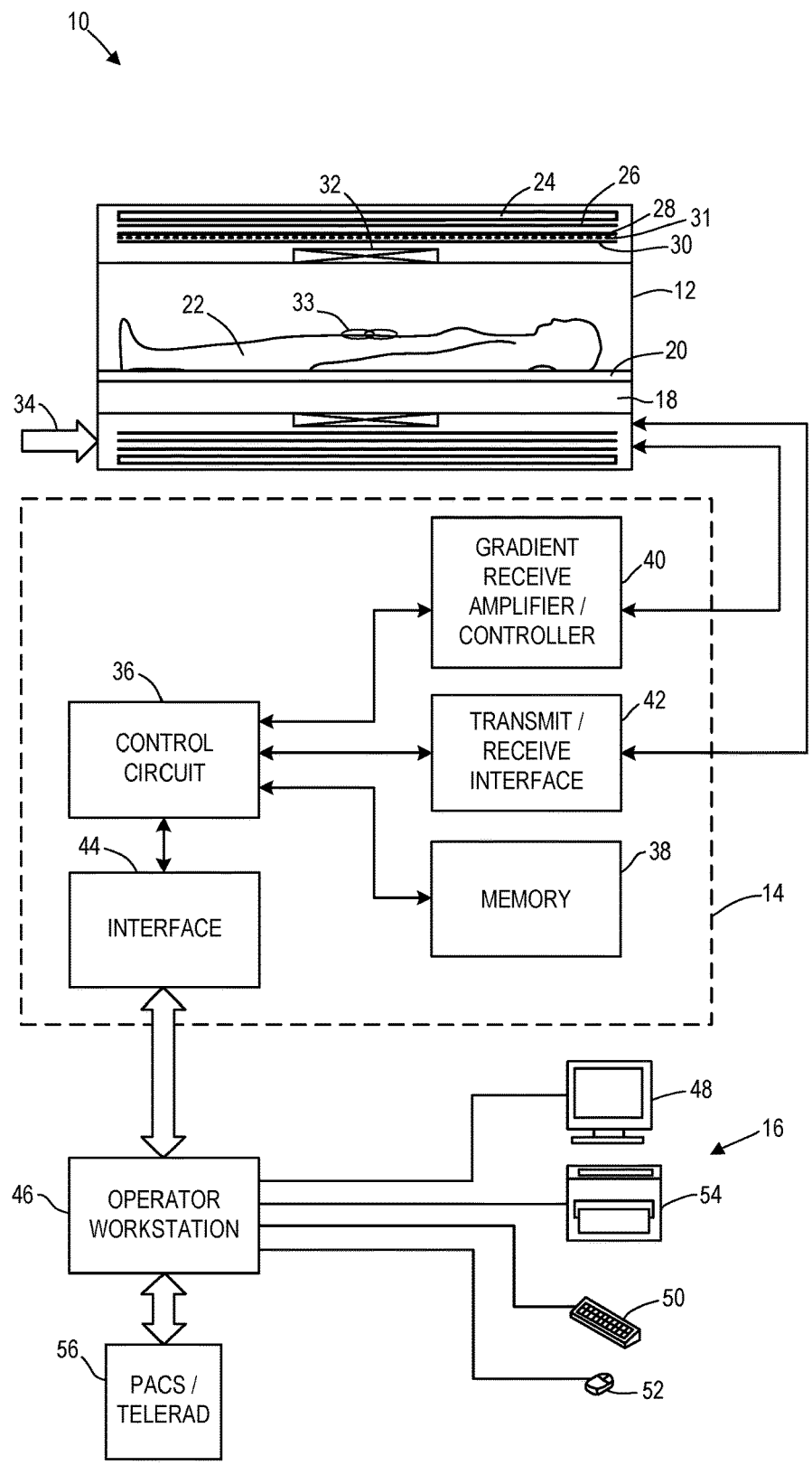
FIG. 1 shows a diagrammatical representation of an MRI system.

Turning now to the drawings, and referring first to FIG. 1, a magnetic resonance imaging (MM) system 10 is illustrated diagrammatically as including a scanner 12, scanner controller circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28, and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference number 34. In the embodiment illustrated in FIG. 1, the RF coil 32 may also serve as a receiving coil. Thus, the RF coil 32 may be coupled with receiving and driving circuitry in passive and active modes for receiving emissions from the gyromagnetic material and for applying RF excitation pulses, respectively. Alternatively, various configurations of receiving coils may be provided separate from RF coil 32, such as RF coil 33. Such coils may include structures specially adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars, or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in a rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogeneous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

One or more shielding coils, such as shielding coil 31, may be present. The shielding coil 31 comprises turns of a conductive material configured to carry current in an opposite direction as a respective gradient coil, such as coil 30. Like the primary coil, the shielding coil includes a shielding x-coil, a shielding y-coil, and a shielding z-coil. The shielding coil 31 is configured to create a magnetic field that is substantially the opposite of the field created by the primary coil for regions outside of the shielding coil 31. For example, the shielding coil 31 is designed to minimize the stray fields from the primary coil that might otherwise induce eddy currents in other conducting structures, such as a cryostat (not shown). It is important to minimize the production of eddy currents in order to prevent the generation of time-varying magnetic fields that would otherwise negatively impact the performance of the MRI system.

The pulsed gradient fields may perform various functions integral to the imaging process. Some of these functions are slice selection, frequency encoding, and phase encoding. These functions can be applied along the x-, y-, and x-axes of the original coordinate system or along other axes determined by combinations of pulsed current applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phases differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radio frequency pulses. In the diagrammatical view of FIG. 1, the control circuitry 14 thus includes a control circuit 36 for commanding the pulse sequences employed during the examinations, and for processing received signals. The control circuit 36 may include a suitable programmable logic device, such as a CPU or digital signal processor. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32 and/or RF coil 33. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference number 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference number 56 in FIG. 1. Such devices may include picture archiving and communications systems (PACS), teleradiology systems (telerad), and the like.

FIG. 2 is a block diagram of an embodiment of a receive section of a magnetic resonance imaging (MM) system including an RF coil array 201. RF coil array 201 is a non-limiting example of RF coil 33 of FIG. 1. It should be realized that although the receive section is described with respect to the RF coil array 201, the receive section may be utilized with any of the RF coils described herein. For example, each channel of a body RF coil, such as RF coil 32 of FIG. 1, may also be coupled to a receive section as described herein.

As illustrated in FIG. 2, various embodiments may be implemented in connection with a receive section 200 of an MRI system. The receive section 200 is configured to acquire MR data using an RF coil array 201 such as the RF coils 32 and 33 described herein. As discussed, the RF coil array 201 that includes a plurality of RF receiver coils 202 (illustrated as a single block element in FIG. 2 for simplicity). For example, the RF coil array 201 may include a plurality of loop and/or butterfly elements that form the RF receiver coils 202. The RF receiver coils 202 are configured to detect MR signals. The RF receiver coils 202 are also isolated from each other using preamplifiers 210 that also amplify received MR signals from the RF receiver coils 202. In the exemplary embodiment, the RF coil array 201 is a dedicated receive only coil array. Alternatively, the RF coil array 201 is a switchable array, such as a switchable transmit/receive (T/R) phased array coil. Portions and/or an entirety of the receive section 200 may be referred to herein as a "system".

Thus, the RF coil array 201 forms part of the multi-channel receive section 200 connected to an MRI system. The receive section 200 includes a plurality of channels (Rcvr 1 . . . Rcvr N), for example, twenty channels. However, it should be noted that more or less channels may be provided based on the quantity of RF coils 202 utilized to form the RF coil array 201. In the exemplary embodiment, the RF coil array 201 is connected to the multi-channel receive section 200 having a multi-channel system interface 220 (e.g., a 1.5 T System Interface), with a separate receive channel 222 connected to each one of the plurality of the RF receiver coils 202 (e.g., sixteen channels connected to a four by four coil array).

The system interface 220 may include a plurality of bias control lines 224 (illustrated as two lines) to control the switching of decoupling circuits (not shown), which may be controlled, for example, using a coil configuration file stored in the MRI system and/or based on a user input. For example, based on a user input, a particular coil configuration file may be selected to control the RF coil array 201 configured as a T/R phased array coil in a particular imaging mode (e.g., user control of mode of operation using controls on an MRI scanner). An RF IN control line 226 also may be provided in connection with, for example, a combiner (not shown) to control a transmit coil array.

FIG. 3 is a schematic diagram of a portion of the receive section 200 illustrating an embodiment of one of the RF receiver coils 202 and an embodiment of a corresponding pre-amplifier 210. In the exemplary embodiment, the pre-amplifier 210 has a relatively low input impedance. For example, in some embodiments, a "relatively low" input impedance of the preamplifier 210 is less than approximately 5 ohms at resonance frequency. The input impedance of the preamplifier 210 is defined by an inductor 230, which is shown in FIG. 7. Referring again to FIG. 3, the input impedance of the preamplifier 210 is represented by $Z_{IN}$. In some embodiments, the preamplifier 210 has an input impedance of between approximately 1 ohm and approximately 3 ohms at resonance frequency. Moreover, in some embodiments, the preamplifier 210 has an input impedance of approximately 2 ohms at resonance frequency. It should be noted that for purposes of illustration, all of the capacitors are considered lossless and the inductors are represented with a series resistance. The input impedance of the preamplifier 210 may be referred to herein as a "preamplifier input impedance."

The RF receiver coil 202 includes an RLC resonant circuit formed from a resistor 250, an inductor 252, and a capacitor 254. The RF receiver coil 202 is also connected in series to an impedance transformer 256. More specifically, the impedance transformer 256 is electrically connected between the RF receiver coil 202 and the preamplifier 210. The impedance transformer 256 forms an impedance matching network between the RF receiver coil 202 and the preamplifier 210. The impedance transformer 256 is configured to transform a coil impedance of the RF receiver coil 202 into a source impedance of the preamplifier 210. The source impedance of the preamplifier 210 is represented in FIG. 3 by $Z_{OUT}$. The coil impedance of the RF receiver coil 202 may have any value, which may be dependent on coil loading, coil size, field strength, and/or the like. Examples of the coil impedance of the RF receiver coil 202 include, but are not limited to, between approximately 2 ohms and approximately 10 ohms at 1.5 T field strength, and/or the like.

In one exemplary embodiment, the impedance transformer 256 includes a lattice-type balun. More specifically, the impedance transformer 256 includes two inductors 260 and 262 and two capacitors 264 and 266. The inductor 260 is connected in series to the capacitor 264, while the inductor 262 is connected in series with the capacitor 266. The inductor 260 and the capacitor 264 are connected in parallel to the inductor 262 and the capacitor 266. In the exemplary embodiment, the arrangement of the lattice-type balun impedance transformer 256 produces a +/−90° phase shift. Each of the inductors 260 and 262 may be referred to herein as a "first" and/or a "second" inductor. The capacitors 264 and 266 may be referred to herein as a "first" and/or a "second" capacitor.

The impedance transformer 256 is configured to transform the coil impedance of the RF receiver coil 202 into a relatively high source impedance $Z_{OUT}$. For example, in some embodiments, a "relatively high" source impedance $Z_{OUT}$ is at least approximately 100 ohms. Accordingly, in the exemplary embodiment, the impedance transformer 256 is configured to transform the coil impedance of the RF receiver coil 202 into a source impedance $Z_{OUT}$ of at least approximately 100 ohms. In some embodiments, the impedance transformer 256 is configured to transform the coil impedance of the RF receiver coil 202 into a source impedance $Z_{OUT}$ of at least approximately 300 ohms, at least approximately 400 ohms, or at least approximately 500 ohms. Exemplary values for the inductors 260 and 262 include, but are not limited to, approximately 123.5 nH. Exemplary values for the capacitors 264 and 266 include, but are not limited to, approximately 51 pF.

The impedance transformer 256 also provides a blocking impedance to the RF receiver coil 202. Transformation of the coil impedance of the RF receiver coil 202 to a relative high source impedance $Z_{OUT}$ may enable the impedance transformer 256 to provide a higher blocking impedance to the RF receiver coil 202. Because the relatively high source impedance $Z_{OUT}$ of the preamplifier 210 is greater than, for example, the conventional value of approximately 50 ohms, the reactance X of the inductors 260 and 262 and the capacitors 264 and 266 of the impedance transformer 256 are increased. For example, the reactance XC of each of the capacitors 264 and 266 and the reactance XL of each of the inductors 260 and 262 can be defined by the equation: $XC=XL=\sqrt{(R1 \times R2)}$; where R1 is the coil impedance and R2 is the source impedance $Z_{OUT}$. Because the input impedance $Z_{IN}$ of the preamplifier 210 is relatively low, the impedance transformer 256 forms a parallel resonance circuit that results in a higher impedance at an output 270 of the RF receiver coil 202. As the reactances XC and XL increase, the blocking impedance increases because the blocking impedance is directly proportional to the values of XC and XL. The higher blocking impedance suppresses an increased amount of RF current along the RF receiver coil 202, which may ultimately result in a higher SNR ratio because of fewer interactions between RF receiver coils 202 and/or less correlated noise. Exemplary values for such higher blocking impedances include, for example, a blocking impedance of at least 500 ohms, and at least 1000 ohms.

The impedance transformer 256 is not limited to a lattice-type balun structure for transforming the coil impedance of the RF receiver coil 202 into a relatively high source impedance. Rather, any components and arrangement of the connections therebetween may be used to transform the coil impedance of the RF receiver coil 202 into a relatively high source impedance, such as, but not limited to, other types of equivalent phase shift baluns, and/or the like.

FIG. 4 is a schematic diagram illustrating an embodiment of the preamplifier 210 shown in FIG. 3. The preamplifier 210 is configured to accommodate the relatively high source impedance $Z_{OUT}$ while providing the relatively low input impedance $Z_{IN}$. The input impedance $Z_{IN}$ of the preamplifier 210 is defined by the inductor 230 of the preamplifier 210. The preamplifier 210 includes an amplifier 280 that receives MR signals from the corresponding RF receiver coil 202 and amplifies the received MR signals. An input circuit 282 is electrically connected to the amplifier 280. The input circuit 282 is electrically connected to the output 270 (shown in FIG. 3) of the corresponding RF receiver coil 202, via the impedance transformer 256 (shown in FIG. 3). The input circuit 282 is configured to transmit the MR signals from the corresponding RF receiver coil 202 to the amplifier 280.

The input circuit 282 includes an impedance transformer 284, which includes a capacitor 286 and the inductor 230. The input circuit 282 also includes a field effect transistor (FET) 288 that is electrically connected between the impedance transformer 284 and the amplifier 280, for example as shown in FIG. 3. The impedance transformer 284 is electrically connected between the amplifier 280 and the corresponding RF receiver coil 202.

In the exemplary embodiment, the FET 288 has a relatively large noise circle, which may be centered in the Smith Chart, for the FET 288 to yield a relatively low noise figure. In other words, the FET 288 is capable of providing a relatively low noise figure over a relatively broad range of source impedance $Z_{OUT}$. For example, in some embodiments, a "relatively large" size of the noise circle of the FET 288 is at least approximately 0.3 decibels. In some embodiments, the noise circle of the FET 288 has a size of at least approximately 0.6 decibels. The size of the noise circle of the FET 288 is dependent on the noise resistance RN of the FET 288. The FET 288 may have any value of noise resistance RN that provides a noise circle having a size of at least 0.3 decibels, such as, but not limited to, less than approximately 0.03 ohms, equal to or less than approximately 0.02 ohms, and/or the like. The location of the noise circle of the FET 288 within the Smith Chart is dependent on the optimum reflection coefficient of the FET 288. For example, the noise circle of the FET 288 may be located closer to the center of the Smith Chart (i.e., closer to being concentric) when the optimum reflection coefficient of the FET 288 is less than approximately 100 ohms. In some embodiments, the noise circle of the FET 288 is centered within the Smith Chart (i.e., concentric with the Smith Chart). In some embodiments, and for example, the FET 288 has an optimum reflection coefficient of less than approximately 100 ohms. In some embodiments, and for example, the FET 288 has an optimum reflection coefficient of between approximately 40 ohms and approximately 60 ohms, for example approximately 50 ohms.

Thus, each RF coil in an MRI system may be coupled to a control circuit via coupling electronics that include an amplifier and matching network. For example, the body coil coupling electronics may include a low input impedance amplifier and an impedance transformer to transform a coil impedance of the body coil to a high source impedance. Likewise, each surface coil coupling electronics may include a low input impedance amplifier and an impedance transformer to transform a coil impedance of that surface coil to a high source impedance. In one example, each impedance transformer may transform a coil impedance of a respective RF coil to a source impedance of at least approximately 100 ohms. The coupling electronics coupled to each RF coil may reduce mutual inductance coupling among the surface coils in a surface RF coil array and further may reduce coupling between the surface RF coil array and the body coil.

As explained previously, surface coil arrays may be used for imaging due to their high SNR even though the local signal intensity in-homogeneity of the surface coil arrays negatively impacts the image quality. Various methods may be used to correct the surface coil in-homogeneous intensity issue. One correction method is to utilize the relatively uniform images acquired from a volume body coil as reference images for local intensity corrections. Simultaneously acquired body coil images may be preferable relative to sequentially acquired body coil images to be used as reference images for surface coil local intensity corrections. However, in order to perform simultaneous acquisitions, both the body coil and the surface coils need to be well isolated from each other, otherwise the coupling between the coils will result in destructive impacts on the image quality of both the body coil images and the surface coil images. Thus, the sequential body coil and surface coils acquisition technique may be used to acquire images from body coil sequentially and interleaving with surface coils for image intensity corrections. With the sequential imaging, only one of the coils is enabled at a time, e.g., when the body coil is enabled to pick up signals, the surface coils are disabled; and vice versa to avoid the destructive interference between body coil and surface coils. The sequential acquisition prolongs the scan process in general since it not only requires additional time for body coil to receive signals but also requires extra time to switch on or off between body coil and surface coils.

However, simultaneous acquisition imaging may be possible if sufficient decoupling of both the body coil and the surface coils is present. For various reasons, there is a lot of variability in the decoupling efficiency of the surface coils due to coil design (e.g., coil impedance matching) and amplifier design (e.g., input impedance). The poor decoupling of the surface coils distorts the body coil images and simultaneous acquisition. On the other hand, the body coil is well decoupled. Accordingly, the decoupling efficiency determines how much the body coil and surface coils interact with each other. The decoupling impedance of the body coil only determines how much the body coil impacts the other surface coils, and the decoupling impedance of the surface coils only determines how much the surface coils impact the body coil.

As the interaction is solely due to the ineffective surface coil decoupling (the body coil is well decoupled), the surface coils may be used to receive MR signals without disabling the body coil due to the fact that the body coil does not couple to the surface coils. In other words, a body coil and a surface coil may be simultaneously enabled in receive mode even though only the surface coil images are useful, because the body coil images are distorted due the coupling from the surface coil.

The existence of surface coil coupling to the body coil only indicates disabling of the surface coils when the body coil is used for signal reception; but it does not indicate disabling of the body coil when a surface coil is used for MR signal reception as long as body coil does not impact surface coils.

Thus, as explained in more detail below, an interleaved body coil and surface coil acquisition scheme may be performed during a calibration scan, in which the body coil remains in the enable condition without going through "on" and "off" switching and only the surface coils are switched between "on" and "off" state.

By leaving a body coil always in the "on" state, the process of switching the body coil at all may be eliminated and hence the time (up to 50 μsec) required to switch the body coil as well as the time to activate auxiliary switching control lines may be eliminated.

The interleaved acquisition takes longer than simultaneous acquisition because it still uses additional time for the body coil to receive the signals from the same anatomy. Nevertheless, it provides faster sequential transition between body coil and surface coil signal receptions with the elimination of the switching time required for body coil (e.g., up to 50 μs).

Figure 5:
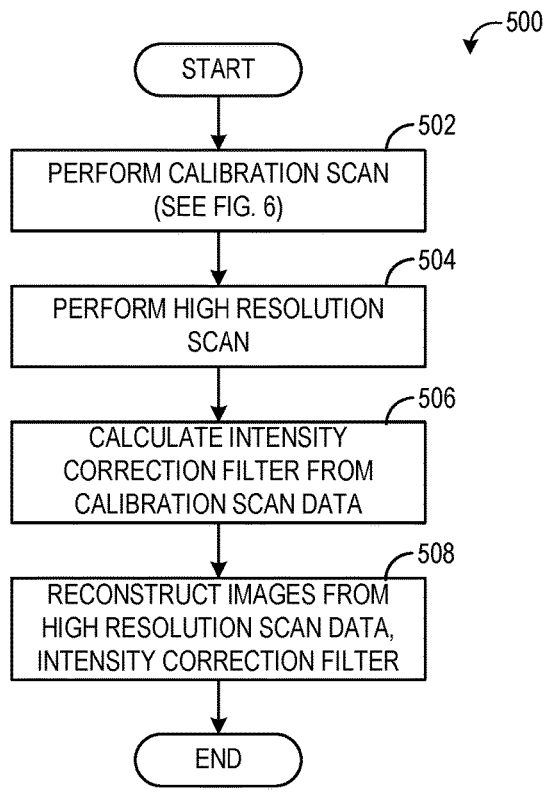
FIG. 5 is a flow chart illustrating a method for operating an MM system.

Turning to FIG. 5, a method 500 for operating a magnetic resonance imaging (MM) system is provided. Method 500 may be at least partially carried out by a processor, such as a processor of control circuit 36 of FIG. 1, in order to perform imaging using a body RF coil (such as body RF coil 32 if FIG. 1) and one or more surface coils (such as surface RF coil 33 of FIG. 1). At 502, method 500 includes performing a calibration scan. The calibration scan may be performed prior to obtaining high-resolution images during standard scanning. The calibration scan may be used to correct for image intensity variations in the high-resolution images. For example, high-resolution images obtained with surface RF coils may exhibit highest image intensity in regions corresponding to areas of the surface RF coils that are closest to the anatomy/subject being imaged. To increase intensity uniformity across the images, the intensity of the high-resolution images may be corrected based on image intensity information obtained from reference images generated from MR signals obtained by the body coil. The calibration scan may include an interleaved acquisition scheme, where the body coil reference images are obtained with the surface coils deactivated, to prevent image degradation that may result from the surface coils, which are not sufficiently decoupled. The body coil may remain activated while the surface coils are activated to obtain the surface coil reference images, as the body coil is sufficiently decoupled from the surface coils. Additional details regarding the calibration scan are presented below with respect to FIG. 6.

At 504, method 500 includes performing one or more high resolution scans. The high resolution scans may include transmitting RF pulses with the body coil in a transmit mode and receiving resultant MR signals with the surface coils in a receive mode. At 506, an intensity correction filter is calculated from the calibration scan data. The calibration scan data may include image data of a region of interest of a subject obtained by the body coil in the receive mode and image data of the region of interest obtained by the surface coils in the receive mode. In one example, the image information for a given body coil reference image may include an intensity value for each pixel location of the body coil reference image. The image information for a corresponding surface coil reference image may include an intensity value for each pixel location of the surface coil reference image. The intensity correction filter may be determined by dividing the intensity values of the surface coil reference image by the intensity values of the body coil reference image, or another suitable method.

At 508, high-resolution images are reconstructed from the high-resolution scan image information (e.g., the received MR signals). The images may be reconstructed according to a suitable reconstruction algorithm. During reconstruction and/or after reconstruction, the intensity correction filter may be applied. For example, each pixel intensity value of a reconstructed image may be multiplied by a corresponding pixel intensity value of the filter to generate an intensity-corrected reconstructed image. The intensity-corrected reconstructed image may be displayed on a coupled display device, saved in memory of the MRI system and/or a remote device, or other suitable action. Method 500 then ends.

Figure 6:
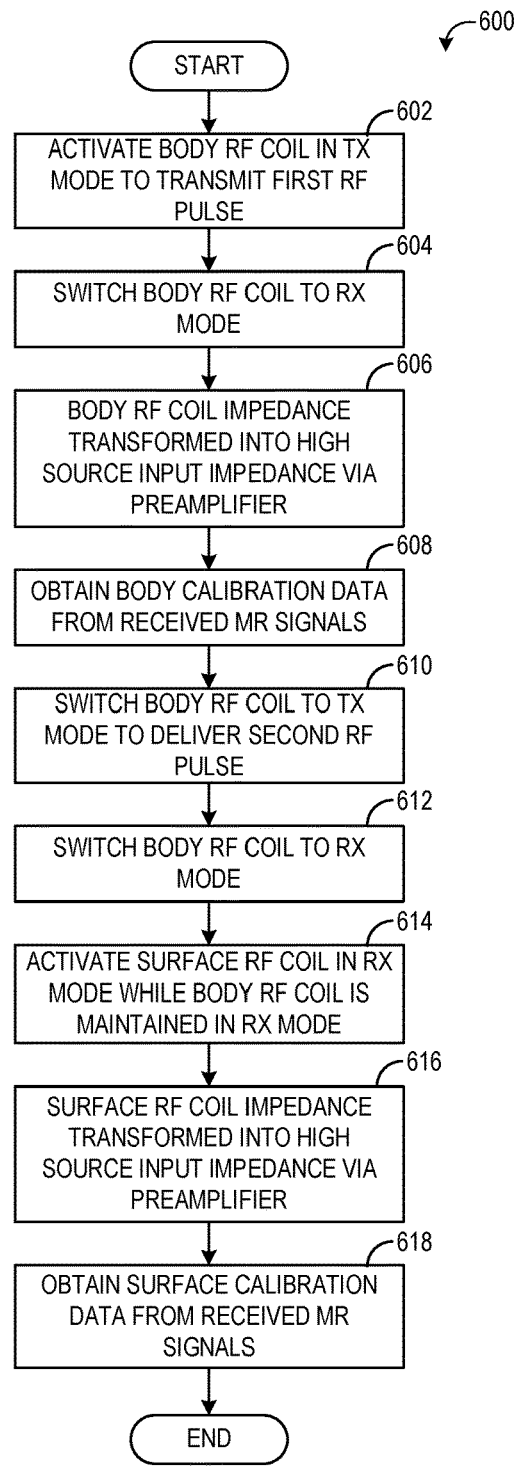
FIG. 6 is a flow chart illustrating a method for performing a calibration scan with an MM system.
Figure 7A:
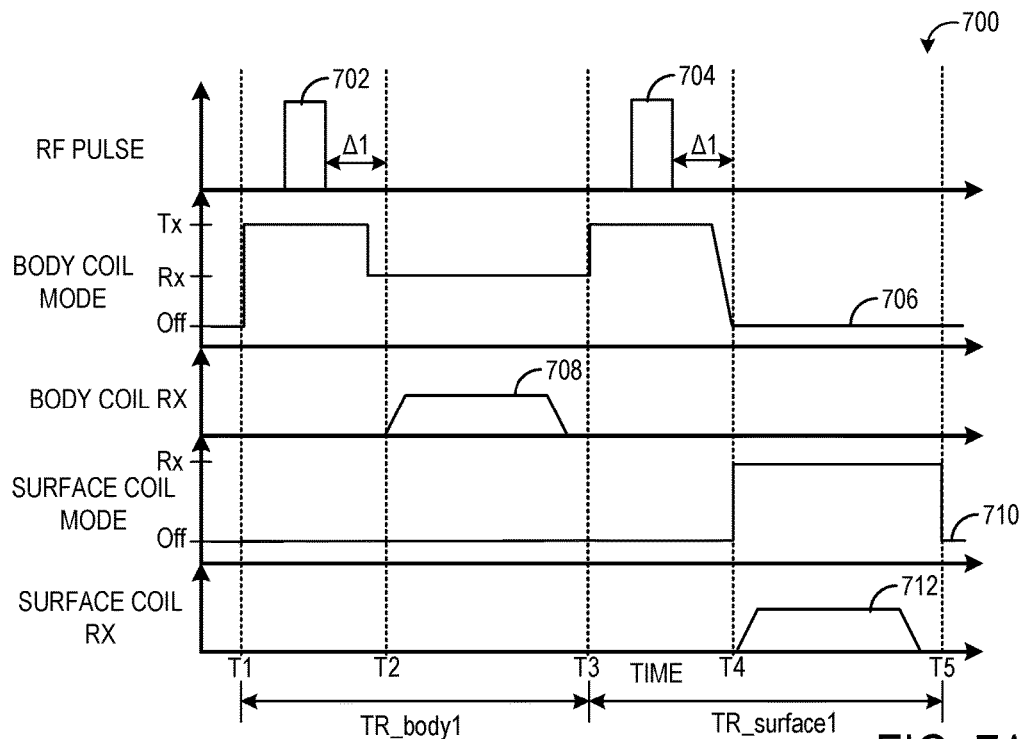
FIGS. 7A and 7B illustrate example parameters during calibration scan sequences.
Figure 7B:
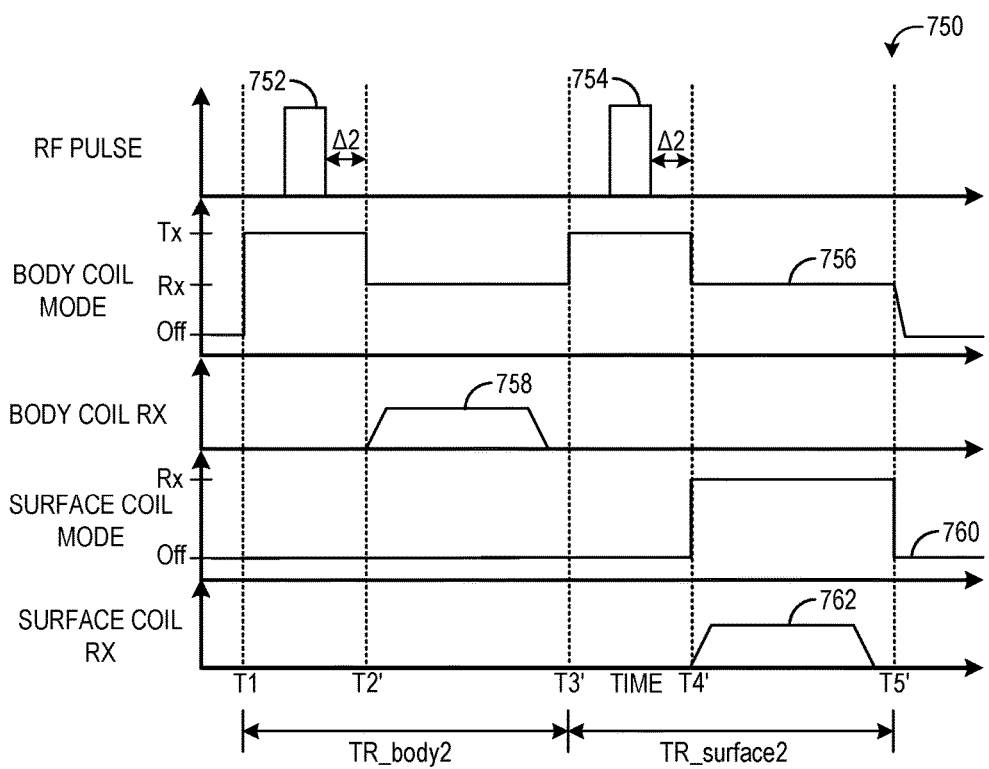

FIG. 6 illustrates a method 600 for performing an interleaved acquisition scheme during a calibration scan. Method 600 may be at least partially carried out by a processor, such as a processor of control circuit 36 of FIG. 1, in order to perform imaging using a body RF coil (such as body RF coil 32 if FIG. 1) and one or more surface coils (such as surface RF coil 33 of FIG. 1). Method 600 may be performed as part of method 500, e.g., method 600 may be performed to acquire the calibration scan data used to generate the intensity correction filter described above with respect to method 500.

At 602, method 600 activates the body RF coil in a transmit (Tx) mode to transmit a first RF pulse. For example, the control circuit 36 may command the body RF coil be operated in the Tx mode via the transmit/receive interface 42, and as a result, the body RF coil may be coupled to a transmitter and hence receive power, resulting in RF signals being transmitted to the subject being imaged by the MM system. At 604, method 600 switches the body RF coil from the Tx mode a receive (Rx) mode. For example, the control circuit may command the body RF coil be operated in the Rx mode via the transmit/receive interface, which may result in the body RF coil being isolated from the transmitter and coupled to its pre-amplifier. Thus, RF signals received by the body RF coil may sent to the control circuit for further processing.

At 606, method 600 includes transforming the body RF coil impedance into high source input impedance via the preamplifier. For example, as explained above with respect to FIGS. 2-4, the body RF coil may be coupled to coupling electronics including a preamplifier and matching network that transforms the impedance into a high source input impedance (e.g., 100 Ohms or greater), which may decouple the body RF coil from the surface RF coils. At 608, body coil calibration data is obtained from the received MR signals (e.g., from the RF signal echoes detected by the body RF coil in the Rx mode). The body coil calibration data may be saved in memory (e.g., memory 38 of FIG. 1) as raw MR signal data and/or the data may be processed and the processed data may be saved (e.g., image data including pixel intensity values for each pixel of one or more images). During the body coil scan (e.g., during the actions performed at 602 through 610), the surface RF coils may remain deactivated (e.g., isolated from their respective pre-amplifiers) to avoid degraded image quality that may arise from coupling of the surface RF coils to the body RF coil.

At 610, the body RF coil is switched back to the Tx mode to deliver a second RF pulse. At 612, the body RF coil is again switched to the Rx mode. At 614, the surface RF coils are activated in the Rx mode while the body RF coil is maintained in the Rx mode. For example, the control circuit may command the surface RF coils to be activated in the Rx mode via the transmit/receive interface, and the surface RF coils may each be coupled to a respective pre-amplifier to allow MR signals detected by the surface RF coils to be sent to the control circuit for further processing. At 616, the surface RF coil impedance of each surface RF coil is transformed into high source input impedance (e.g., 100 Ohms or greater) via a respective pre-amplifier and matching network. In this way, decoupling is provided to both the body RF coil and surface RF coils.

At 618, surface RF coil calibration data is obtained from the received MR signals (e.g., from the RF signal echoes detected by the surface RF coils in the Rx mode). The surface coil calibration data may be saved in memory (e.g., memory 38 of FIG. 1) as raw MR signal data and/or the data may be processed and the processed data may be saved (e.g., image data including pixel intensity values for each pixel of one or more images). During the acquisition of the surface coil MR signals, the body RF coil remains enabled in the Rx mode. However, any signals received from the body RF coil may be discarded (e.g., not saved in memory). The sequence described in method 600 may be repeated until sufficient calibration data is received. If the sequence is repeated, the surface RF coils may be deactivated prior to a subsequent RF pulse being transmitted by the body RF coil. Once sufficient calibration data is obtained, the body RF coil and surface RF coils may be deactivated or high resolution scanning of the subject may commence.

FIGS. 7A and 7B show example parameters of the MRI system during pulse-echo sequences of a calibration scan. FIG. 7A is a diagram 700 of sequentially-performed sequences, wherein the body RF coil is disabled during surface RF coil scanning. FIG. 7B is a diagram 750 of interleaved sequences, wherein the body RF coil remains activated during surface RF coil scanning, such the scanning sequence carried out during execution of method 600. Each diagram includes an RF pulse plot (representing RF pulses transmitted by the body RF coil in Tx mode), a body RF coil mode plot (representing which mode the body RF coil is commanded to operate in, including Tx, Rx, and off), a body RF coil Rx plot (representing operation of the body RF coil in the Rx mode where the signals detected by the body RF coil are sampled and saved), a surface RF coil mode plot (representing which mode the surface RF coils are commanded to operate in, including Rx and off), and a surface RF coil Rx plot (representing operation of the surface RF coils in the Rx mode where the signals detected by the surface RF coils are sampled and saved). For each plot, time is depicted along the horizontal, x-axis, and values of each respective parameter is depicted along the vertical, y-axis. It is to be understood that the curves illustrated in each plot are representative and the actual signals transmitted and received may have a different appearance.

Referring first to diagram 700, at time T1 a body RF coil scan is initiated. As such, the body RF coil is commanded to the Tx mode, as shown by curve 706. As a result, the body RF coil is activated in the Tx mode, and the body RF coil is coupled to the transmitter and hence receives power. A resultant first RF pulse is transmitted, as shown by curve 702. The RF pulse may be controlled to be a given duration and strength depending on the specifics of the anatomy being scanned and desired imaging parameters. Once the RF pulse is transmitted, the body RF coil is commanded to the Rx mode, which occurs prior to time T2. At time T2, the body RF coil is in the Rx mode and the MR signals obtained by the body RF coil begin to be sampled (shown by curve 708). The MR signals emitted from the subject may be the strongest following the RF pulse and begin to decay. Hence, it may be desirable to sample the MR signals detected by the body RF coil as soon as possible following the RF pulse. However, as explained in more detail below, the timing of the sampling of the MR signals detected by the body RF coil are controlled to match the timing of the sampling of the MR signals detected by the surface RF coils, which may be delayed due to the switching off of the body RF coil in the sequential acquisition scheme. Thus, the sampling of the body RF coil may be controlled to begin at a predefined time ($\Delta 1$) that is equal to the time after the RF pulse and start of sampling for the surface RF coils.

At time T3, the body RF coil is commanded to be switched from the Rx mode back to the Tx mode and a second RF pulse 704 is transmitted. Following the second RF pulse, the body RF coil is switched off. However, the process of switching off the body RF coil is not instantaneous and takes longer than switching the body RF coil from the Tx mode to the Rx mode. Hence, the surface RF coil is commanded to the Rx mode (as shown by curve 710) only after the body RF coil is fully disabled, at time T4. Sampling of the surface RF coils begins at time T4, as shown by curve 712. At time T5, the surface RF coils are deactivated and the sequential scanning sequence is complete. Additional pulse-echo sequences may be performed by activating the body RF coil in the Tx mode, if indicated.

In MRI systems, echo time (TE) represents the time from the center of the RF pulse to the center of the resultant echo. The repetition time (TR) represents the length of time between corresponding consecutive points on a repeating series of pulses and echoes (e.g., the time from the application of an excitation pulse to the application of the next pulse). Depicted along the bottom of diagram 700 are two TR times, TR_body1 and TR_surface1. In order to generate consistent reference images, the MRI system may be controlled such that TR is the same for the body coil scan and the surface coil scan. Thus, even though it may take less time to switch the body RF coil from Tx mode to Rx mode than switching off the body RF coil altogether, the body RF coil calibration scan sequence may be controlled to have a TR that is equal to the TR of the surface coil scan, as appreciated by the TR_body1 being equal to TR_surface1. Further, the time $\Delta 1$ is dictated by the amount of time it takes to turn off the body RF coil and activate the surface RF coil. To ensure equal TR, the time from when the first RF pulse ends to when the sampling by the body RF coil in the Rx mode begins may be controlled to be equal to $\Delta 1$, even though it takes less time for the body RF coil to switch to the Rx mode than be deactivated. For example, as shown, the TR_body1 may be controlled to be equal to TR_surface1 by controlling when sampling of the body coil begins. In other examples, the TR_body1 may be controlled to be equal to TR_surface1 by turning off the body coil following the RF pulse and then reactivating the body coil in the Rx mode.

In contrast, diagram 750 illustrates the interleaved calibration acquisition scheme. During the interleaved acquisitions scheme, the body RF coil is maintained activated the entire time, and is switched from Tx mode to Rx mode as needed, while the surface RF coils are controlled to prevent coupling. As a result, the time from the end of the RF pulses to when the body RF coil and the surface RF coils may begin sampling the resultant MR signals may be less than with the sequential scheme discussed above.

As shown in diagram 750, the acquisition scheme starts at time T1, when the body RF coil is activated in the Tx mode. A first RF pulse is transmitted, as shown by curve 752. At time T2', the body RF coil mode is switched to the Rx mode (as shown by curve 756) and sampling of the MR signals by the body RF coil commences, as shown by curve 758. Once the MR signals have been sampled and sent to the control circuit for processing and/or saving, the body RF coil mode is switched back to the Tx mode, at time T3'. A second RF pulse is transmitted, shown by curve 754. Following the transmission of the second RF pulse, the body RF coil is switched back to the Rx mode, at time T4'. Because the amount of time to switch from the Tx mode to the Rx mode is smaller than the amount of time to turn off the body RF coil, the activation of the surface RF coils can also occur at time T4', as shown by curve 760, rather than waiting for the body RF coil to be deactivated, and sampling of the surface RF coils commences at time T4'. At time T5', the surface RF coils are deactivated. The body RF coil may be switched back to the Tx mode if another pulse-echo sequence is to be performed, or the body RF coil may be deactivated at time T5'.

As appreciated by TR_body2 and TR_surface2 along the bottom of diagram 750, TR_body2 and TR_surface2 are equal, and are also shorter than TR_body1 and TR_surface1. Likewise, the time needed to switch from the body coil in the Tx mode to the surface coil in the Rx mode ($\Delta 2$) in diagram 750 is shorter than the time needed to deactivate the body coil and activate the surface coil in the Rx mode ($\Delta 1$) in diagram 700. This is because deactivation of the body coil includes turning off high power PIN diodes, while switching the body coil from Tx to Rx only includes low power PIN diodes inside a TR switch box. In general, the higher power rating of a PIN diode takes more time to charge or discharge, which directly determines the switching time.

While not shown in diagram 700 or 750, a gradient pulses may be applied (e.g., via the gradient coils discussed above with respect to FIG. 1) to generate gradient echoes. The duration and amplitude of the gradient pulses are the same in diagram 700 and diagram 750, and as such the gradient pulses do not contribute to the TE and TR differences between diagram 700 and diagram 750.

Thus, the interleaved acquisition scheme disclosed herein may reduce the time needed to obtain body coil and surface coil calibration information used to generate an intensity correction filter that is ultimately applied to reconstructed images obtained from subsequent surface coil scans. For example, by eliminating deactivation of the body coil, up to 50 µs may be saved per TR. During a typical calibration scan, 1024 pairs of body coil and surface coil TRs may be performed (e.g., 32 phase encodes by 32 slice encodes), and hence a significant overall time savings may be provided.

A technical effect of the interleaved calibration scan disclosed herein is decreased scanning time and increased accuracy of registration between reference body coil images and reference surface coil images.

An embodiment relates to a method for acquiring a medical image. The method includes activating a body radio frequency (RF) coil in a body coil receive mode to obtain body calibration information of a subject; while the body RF coil is in the body coil receive mode, activating a surface RF coil in a surface coil receive mode to obtain surface calibration information of the subject; and correcting a reconstructed image with an intensity correction filter determined from the body calibration information and surface calibration information.

The method may further include activating the body RF coil in a transmit mode to transmit a first RF pulse to the subject. Activating the body RF coil in the body coil receive mode may include switching the body RF coil from the transmit mode to the body coil receive mode. Activating the surface RF coil in the surface coil receive mode while the body RF coil is in the body coil receive mode may include, after obtaining the body calibration information, switching the body RF coil back to the transmit mode to transmit a second RF pulse and then switching the body RF coil to the body coil receive mode and activating the surface RF coil in the surface coil receive mode. The method may further include obtaining surface scan image information with the surface RF coil in the surface coil receive mode and reconstructing the image from the surface scan image information. Activating the body RF coil in the body coil receive mode may include activating the body RF coil in the body coil receive mode while the surface RF coil is not activated. The method may further include transforming impedance of the body RF coil into a high source input impedance via a preamplifier. The method may further include transforming impedance of the surface RF coil into a high source input impedance via a preamplifier.

An embodiment relates to a magnetic resonance imaging (MM) system. The MM system includes a body radio frequency (RF) coil; a surface RF coil; and a control circuit. The control circuit is configured to activate the body RF coil in a body coil receive mode to obtain body calibration information of a subject; activate the surface RF coil in a surface coil receive mode, without deactivating the body RF coil, to obtain surface calibration information of the subject; generate an intensity correction filter from the body calibration information and the surface calibration information; and reconstruct an image from additional surface scan image information and the intensity correction filter. The MM system may further include a preamplifier coupled to the body RF coil, the preamplifier including an amplifier; and an impedance transformer to transform a coil impedance of the body RF coil to a source impedance of at least approximately 100 ohms. The Mill system may further comprise a preamplifier coupled to the surface RF coil, the preamplifier including an amplifier; and an impedance transformer to transform a coil impedance of the surface RF coil to a source impedance of at least approximately 100 ohms. The surface RF coil may be a surface RF coil of a plurality of surface RF coils arranged into an array, each surface RF coil of the plurality of surface RF coils coupled to a respective preamplifier. The control circuit may be further configured to activate the body RF coil in a transmit mode to transmit an RF pulse to the subject prior to activating the body RF coil in the body coil receive mode. The control circuit may be further configured to maintain the surface RF coil deactivated when the body RF coil is in the transmit mode and when the body RF coil is in a body coil receive mode to obtain the body calibration information.

Another embodiment relates to a magnetic resonance imaging (MRI) system. The MRI system includes a gantry having a bore extending therethrough; a body radio frequency (RF) coil positioned within the gantry and coupled to first coupling electronics, the first coupling electronics comprising a first low input impedance amplifier and a first impedance transformer to transform a coil impedance of the body RF coil to a high source impedance; a surface RF coil array configured to be inserted into the bore, each surface RF coil of the surface RF coil array coupled to respective second coupling electronics, each second coupling electronics comprising a second low input impedance amplifier and a second impedance transformer to transform a coil impedance of a respective surface RF coil to a high source impedance; and a control circuit. The control circuit is configured to activate the body RF coil in a transmit mode to transmit an RF pulse to a subject positioned within the bore of the gantry; switch the body RF coil from the transmit mode to a body coil receive mode with the surface RF coil array inactive; receive first MR signals from the body RF coil in the body coil receive mode; activate the surface RF coil array in a surface coil receive mode without deactivating the body RF coil; receive second MR signals from the surface RF coil array in the surface coil receive mode; and reconstruct an image from subsequent third MR signals obtained from the surface RF coil array, including correcting the reconstructed image using the first MR signals and the second MR signals.

The RF pulse may be a first RF pulse, and the control circuit may be configured to, prior to activating the surface RF coil, switch the body RF coil from the body coil receive mode to the transmit mode to transmit a second RF pulse, and switch the body RF coil from the transmit mode to the body coil receive mode after transmitting the second RF pulse. The control circuit may be configured to activate the surface RF coil array in the receive mode while the body RF coil is in the body coil receive mode. To correct the reconstructed image with the first MR signals and the second MR signals, the control circuit may be configured to determine an intensity correction filter based on the first MR signals and the second MR signals, and apply the intensity correction filter to the reconstructed image. The control circuit is configured to process the first MR signals to generate a body coil reference image including a plurality of first pixels each having a respective first intensity value; process the second MR signals to generate a surface coil reference image including a plurality of second pixels each having a respective second intensity value; and determine the intensity correction filter by dividing each second intensity value by a corresponding first intensity value. To apply the intensity correction filter to the reconstructed image, the control circuit may be configured to multiply each pixel intensity value of the reconstructed image by a corresponding pixel intensity value of the intensity correction filter, thereby generating an intensity-corrected reconstructed image. The MRI system may further include a display device operatively coupled to the control circuit, and the control circuit may be configured to send the intensity-corrected reconstructed image to the display device for display on the display device.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for acquiring a medical image, comprising:
    activating a body radio frequency (RF) coil in a body coil receive mode to obtain body calibration information of a subject;
    while the body RF coil is in the body coil receive mode, activating a surface RF coil in a surface coil receive mode to obtain surface calibration information of the subject; and
    correcting a reconstructed image with an intensity correction filter determined from the body calibration information and the surface calibration information.

2. The method of claim 1, further comprising activating the body RF coil in a transmit mode to transmit a first RF pulse to the subject, and wherein activating the body RF coil in the body coil receive mode comprises switching the body RF coil from the transmit mode to the body coil receive mode.

3. The method of claim 2, wherein activating the surface RF coil in the surface coil receive mode while the body RF coil is in the body coil receive mode comprises, after obtaining the body calibration information, switching the body RF coil back to the transmit mode to transmit a second RF pulse and then switching the body RF coil to the body coil receive mode and activating the surface RF coil in the surface coil receive mode.

4. The method of claim 1, further comprising obtaining surface scan image information with the surface RF coil in the surface coil receive mode and reconstructing an image from the surface scan image information.

5. The method of claim 1, wherein activating the body RF coil in the body coil receive mode comprises activating the body RF coil in the body coil receive mode while the surface RF coil is not activated.

6. The method of claim 1, further comprising transforming impedance of the body RF coil into a high source input impedance via a preamplifier.

7. The method of claim 1, further comprising transforming impedance of the surface RF coil into a high source input impedance via a preamplifier.

8. A magnetic resonance imaging (MRI) system, comprising:
a body radio frequency (RF) coil integrated in a gantry of the MRI system;
a surface RF coil configured to be positioned intermediate the body RF coil and a subject during a scan of the subject; and
a control circuit configured to perform the scan of the subject, where to perform the scan, the control circuit is configured to:
activate the body RF coil in a body coil receive mode to obtain body calibration information of the subject;
activate the surface RF coil in a surface coil receive mode, without deactivating the body RF coil, to obtain surface calibration information of the subject;
generate an intensity correction filter from the body calibration information and the surface calibration information; and
reconstruct an image from additional surface scan image information and the intensity correction filter.

9. The MRI system of claim 8, further comprising a preamplifier coupled to the body RF coil, the preamplifier comprising:
an amplifier; and
an impedance transformer to transform a coil impedance of the body RF coil to a source impedance of at least approximately 100 ohms.

10. The MRI system of claim 8, further comprising a preamplifier coupled to the surface RF coil, the preamplifier comprising:
an amplifier; and
an impedance transformer to transform a coil impedance of the surface RF coil to a source impedance of at least approximately 100 ohms.

11. The MRI system of claim 10, wherein the surface RF coil is a surface RF coil of a plurality of surface RF coils arranged into an array, each surface RF coil of the plurality of surface RF coils coupled to a respective preamplifier.

12. The MRI system of claim 8, wherein the control circuit is further configured to activate the body RF coil in a transmit mode to transmit an RF pulse to the subject prior to activating the body RF coil in the body coil receive mode, and wherein during the scan, the surface RF coil is configured to be positioned intermediate the body RF coil and the subject along an axis perpendicular to a longitudinal axis of the gantry.

13. The MRI system of claim 12, wherein the control circuit is further configured to maintain the surface RF coil deactivated when the body RF coil is in the transmit mode and when the body RF coil is in a body coil receive mode to obtain the body calibration information.

14. A magnetic resonance imaging (MRI) system, comprising:
a gantry having a bore extending therethrough;
a body radio frequency (RF) coil positioned within the gantry and coupled to first coupling electronics, the first coupling electronics comprising a first low input impedance amplifier and a first impedance transformer to transform a coil impedance of the body RF coil to a high source impedance;
a surface RF coil array configured to be inserted into the bore, each surface RF coil of the surface RF coil array coupled to respective second coupling electronics, each second coupling electronics comprising a second low input impedance amplifier and a second impedance transformer to transform a coil impedance of a respective surface RF coil to a high source impedance; and
a control circuit configured to:
activate the body RF coil in a transmit mode to transmit an RF pulse to a subject positioned within the bore of the gantry;
switch the body RF coil from the transmit mode to a body coil receive mode with the surface RF coil array inactive;
receive first MR signals from the body RF coil in the body coil receive mode;
activate the surface RF coil array in a surface coil receive mode without deactivating the body RF coil;
receive second MR signals from the surface RF coil array in the surface coil receive mode; and
reconstruct an image from subsequent third MR signals obtained from the surface RF coil array, including correcting the reconstructed image using the first MR signals and the second MR signals.

15. The MRI system of claim 14, wherein the RF pulse is a first RF pulse, and wherein the control circuit is configured to, prior to activating the surface RF coil, switch the body RF coil from the body coil receive mode to the transmit mode to transmit a second RF pulse, and switch the body RF coil from the transmit mode to the body coil receive mode after transmitting the second RF pulse.

16. The MRI system of claim 15, wherein the control circuit is configured to activate the surface RF coil array in the surface coil receive mode while the body RF coil is in the body coil receive mode.

17. The MRI system of claim 14, wherein to correct the reconstructed image with the first MR signals and the second MR signals, the control circuit is configured to determine an intensity correction filter based on the first MR signals and the second MR signals, and apply the intensity correction filter to the reconstructed image.

18. The MRI system of claim 17, wherein the control circuit is configured to:
process the first MR signals to generate a body coil reference image including a plurality of first pixels each having a respective first intensity value;
process the second MR signals to generate a surface coil reference image including a plurality of second pixels each having a respective second intensity value; and
determine the intensity correction filter by dividing each second intensity value by a corresponding first intensity value.

19. The MRI system of claim 17, wherein to apply the intensity correction filter to the reconstructed image, the control circuit is configured to multiply each pixel intensity value of the reconstructed image by a corresponding pixel intensity value of the intensity correction filter, thereby generating an intensity-corrected reconstructed image.

20. The MRI system of claim 19, further comprising a display device operatively coupled to the control circuit, and wherein the control circuit is configured to send the intensity-corrected reconstructed image to the display device for display on the display device.

* * * * *